(12) United States Patent
Saga et al.

(10) Patent No.: US 8,746,833 B2
(45) Date of Patent: Jun. 10, 2014

(54) LIQUID JET HEAD AND LIQUID JET APPARATUS

(75) Inventors: Yukihiro Saga, Chiba (JP); Toshiaki Watanabe, Chiba (JP)

(73) Assignee: SII Printek Inc. (JP)

( * ) Notice: Subject to any disclaimer, the term of this patent is extended or adjusted under 35 U.S.C. 154(b) by 243 days.

(21) Appl. No.: 12/998,815

(22) PCT Filed: Nov. 19, 2009

(86) PCT No.: PCT/JP2009/069623
§ 371 (c)(1),
(2), (4) Date: Jul. 11, 2011

(87) PCT Pub. No.: WO2010/064542
PCT Pub. Date: Jun. 10, 2010

(65) Prior Publication Data
US 2011/0261103 A1 Oct. 27, 2011

(30) Foreign Application Priority Data

Dec. 4, 2008 (JP) ................................ 2008-309784

(51) Int. Cl.
*B41J 29/38* (2006.01)
*B41J 29/393* (2006.01)
*B41J 2/015* (2006.01)

(52) U.S. Cl.
USPC .................................. 347/17; 347/19; 347/20

(58) Field of Classification Search
USPC ....................................... 347/9, 17, 19, 5, 20
See application file for complete search history.

(56) References Cited

U.S. PATENT DOCUMENTS

| 5,851,075 A * | 12/1998 | Imai ......................... 400/120.14 |
| 2005/0104941 A1* | 5/2005 | Tanaka ............................ 347/70 |
| 2008/0043053 A1 | 2/2008 | Suzuki ............................ 347/17 |

FOREIGN PATENT DOCUMENTS

| JP | 63047157 A | * | 2/1988 |
| JP | 04131253 | | 5/1992 |
| JP | 04131253 A | * | 5/1992 |
| JP | 2001301149 | | 10/2001 |
| JP | 2002079665 | | 3/2002 |
| JP | 2003182056 | | 7/2003 |

OTHER PUBLICATIONS

EPO Search Report mailed Aug. 7, 2013 issued in EPC Appln. No. EP 09 83 0309.

* cited by examiner

*Primary Examiner* — Jason Uhlenhake
(74) *Attorney, Agent, or Firm* — Adams & Wilks (57) ABSTRACT

A liquid jet head has a head chip including channels and nozzle holes communicating with respective ones of the channels. The channels have sidewalls each provided with a drive electrode. A temperature sensor is configured to detect a temperature of a liquid in the channels. A drive voltage value setting device is electrically connected to the temperature sensor for determining a magnitude of a drive voltage based on the temperature of the liquid detected by the temperature sensor. A control device performs a control operation that applies a drive voltage of the magnitude determined by the drive voltage value setting device to the drive electrodes of the head chip so as to increase a pressure in each of the channels by deformation of the side walls to thereby discharge the liquid in the channels from the respective nozzle holes.

11 Claims, 7 Drawing Sheets

LIQUID JET HEAD AND LIQUID JET APPARATUS

CROSS-REFERENCE TO RELATED APPLICATIONS

This application is a U.S. national stage application of International Application No. PCT/JP2009/069623 filed Nov. 19, 2008, claiming a priority date of Dec. 4, 2008, and published in a non-English language.

BACKGROUND OF THE INVENTION

1. Technical Field

The present invention relates to a liquid jet head for discharging liquid from nozzle holes to record an image or text on a recording medium, and a liquid jet apparatus including the liquid jet head.

2. Background Art

Presently, as a liquid jet apparatus, there is provided an inkjet recording apparatus (for example, printer or facsimile machine) which discharges ink (liquid) toward a recording medium such as recording paper that is transferred in a predetermined direction to record an image or text. The recording apparatus performs recording by supplying ink from an ink tank via an ink supply tube to an ink jet head (liquid jet head) and discharging ink from nozzle holes of a head chip included in the ink jet head toward a recording medium.

In the above-mentioned head chip, a plurality of channels into which ink is filled are formed in parallel lines at intervals, and the nozzle holes which communicate with the channels are formed. Side walls of the above-mentioned channels are formed of a piezoelectric material, and have drive electrodes formed thereon.

The ink jet head including the head chip structured as described above further includes control means for controlling drive of the above-mentioned head chip. The control means includes a drive circuit board including a drive circuit formed thereon for driving the head chip and a flexible printed board including signal lines formed thereon for connecting the drive circuit and the drive electrodes. In the ink jet head including such control means, by applying drive voltage from the drive circuit via the signal lines to the drive electrodes, the side walls are deformed to increase the pressure in the channels, thereby causing ink in the channels to be discharged from the nozzle holes.

In the foregoing operation of the ink jet head, because viscosity of the above-mentioned ink varies depending on the temperature, an amount of ink discharged from the nozzle holes varies depending on the temperature of the ink. Therefore, conventionally, an inkjet head includes a temperature sensor which is attached to a head chip, for detecting the temperature of ink in the head chip. In an inkjet head including such a temperature sensor, the temperature sensor detects the temperature of ink, the detected value is sent to the drive circuit, the drive circuit determines the magnitude of the drive voltage based on the detected value, and the drive voltage is applied to the drive electrodes. This may keep the amount of discharged ink constant (see, for example, the below-mentioned Patent Document 1).

Patent Document 1: JP 2003-182056 A

However, in the conventional technology described above, because the temperature sensor and the drive circuit are connected via a lead wire, when the ink jet head is manufactured, the temperature sensor with the lead wire, which is packaged on the drive circuit board, is manually routed to the head chip to be fixed using an adhesive or the like, which reduces the production efficiency and is a cause of an increase in cost.

Further, because the lead wire is routed and the temperature sensor is fixed to the head chip as described above, it is necessary to, for example, dispose a damper member or the like in order not to obstruct the work, which restricts the structure of the ink jet head.

Further, when volatilized ink adheres to the lead wire, there is a possibility that the lead wire is corroded. In this case, there is a possibility that the temperature detection becomes incorrect.

A liquid jet head and a liquid jet apparatus according to the present invention have been made in view of the above-mentioned conventional problems, and objects of the present invention are to be able to reduce costs by improving the production efficiency, to be able to reduce restrictions on the structure of the liquid jet head, and to cause incorrect temperature detection to be less liable to occur.

SUMMARY OF THE INVENTION

A liquid jet head according to the present invention includes: a head chip including a plurality of channels into which liquid is filled and which are formed in parallel lines at intervals, drive electrodes which are formed on side walls of the plurality of channels, and nozzle holes which communicate with the plurality of channels; a temperature sensor arranged in the head chip or in proximity to the head chip, for detecting temperature of the liquid in the head chip; and control means including a drive circuit board having a drive circuit packaged thereon for driving the head chip, a flexible printed board having signal lines formed thereon for electrically connecting the drive circuit and the drive electrodes, and drive voltage value setting means for determining magnitude of drive voltage based on a value detected by the temperature sensor, the control means being for applying, from the drive circuit via the signal lines to the drive electrodes, the drive voltage of the magnitude determined by the drive voltage value setting means, the side walls being deformed by applying the drive voltage to the drive electrodes, so as to increase pressure in the plurality of channels by deformation of the side walls to discharge the liquid in the plurality of channels from the nozzle holes, in which the flexible printed board includes connecting wiring formed thereon for electrically connecting the temperature sensor and the drive voltage value setting means.

In the above-mentioned liquid jet head, the connecting wiring for connecting the temperature sensor and the drive circuit is formed on the flexible printed board, and hence it is not necessary to route the connecting wiring when the liquid jet head is manufactured. By providing the flexible printed board between the head chip and the drive circuit board, the temperature sensor and the drive circuit are connected via the connecting wiring on the flexible printed board. Further, the connecting wiring formed on the flexible printed board is less liable to be corroded by liquid than a lead wire or the like.

Further, when the above-mentioned liquid jet head is operated, first, the temperature sensor detects the temperature of liquid in the head chip. The detected value is transmitted via the connecting wiring formed on the flexible printed board to the drive voltage value setting means, and there, the magnitude of the drive voltage is determined based on the detected value. Then, the drive voltage of the determined magnitude is applied from the drive circuit via the signal lines formed on the flexible printed board to the drive electrodes. With this, a side wall of a drive electrode to which the drive voltage is applied is deformed to increase the pressure in the channel, and liquid in the channel is discharged from the nozzle hole. It is to be noted that drive voltage value setting means may be, for example, provided on the above-mentioned drive circuit board, may be provided in a control portion of the liquid jet apparatus, or may be provided elsewhere.

Further, in the liquid jet head according to the present invention, it is preferred that the temperature sensor be packaged on the flexible printed board.

By packaging the temperature sensor in advance on the flexible printed board, the work to attach the temperature sensor becomes unnecessary when the liquid jet head is manufactured. More specifically, by providing the flexible printed board between the head chip and the drive circuit board, the temperature sensor is arranged in proximity to the head chip.

Further, in the liquid jet head according to the present invention, it is preferred that the temperature sensor and the head chip be thermally coupled to each other via the signal lines.

This makes it easier to transmit the temperature of the head chip to the temperature sensor, to thereby improve detection accuracy of the temperature of liquid in the head chip by the temperature sensor.

Further, in the liquid jet head according to the present invention, it is preferred that a land on which the temperature sensor is packaged be formed on the flexible printed board.

By mounting the temperature sensor on the land which is formed on the flexible printed board, the temperature sensor is packaged on the flexible printed board.

Further, in the liquid jet head according to the present invention, it is preferred that the temperature sensor be arranged at a middle portion of the flexible printed board, the flexible printed board being located between the head chip and the drive circuit board, and the land be provided so as to extend from the middle portion of the flexible printed board to a connecting end portion on a head chip side of the flexible printed board.

By this construction, the temperature of the head chip is transmitted to the land and then transmitted from the land to the temperature sensor, and thus, the detection accuracy of the temperature of liquid in the head chip by the temperature sensor is improved.

Further, according to the present invention, it is preferred that the liquid jet head further include a heat conductive resin applied to the temperature sensor.

By this construction, the temperature of the head chip is transmitted via the heat conductive resin to the temperature sensor, and thus, the detection accuracy of the temperature of liquid in the head chip by the temperature sensor is further improved.

Further, in the liquid jet head according to the present invention, it is preferred that the temperature sensor be arranged at a middle portion of the flexible printed board, the flexible printed board being located between the head chip and the drive circuit board, and the heat conductive resin be provided so as to extend from the middle portion of the flexible printed board to a connecting end portion on a head chip side of the flexible printed board.

By this construction, the temperature of the head chip is easily transmitted via the heat conductive resin to the temperature sensor, and thus, the detection accuracy of the temperature of liquid in the head chip by the temperature sensor is further improved.

Further, in the liquid jet head according to the present invention, it is preferred that the signal lines be formed on one surface of the flexible printed board while the temperature sensor be packaged on another surface of the flexible printed board.

By this construction, the location of the packaged temperature sensor is not limited to a side end portion without the signal lines or the like, and the temperature sensor may be arranged at an arbitrary location on the flexible printed board, and, for example, the temperature sensor may be packaged on a middle portion in a width direction of the flexible printed board.

Further, in the liquid jet head according to the present invention, it is preferred that the temperature sensor include a thermistor.

By this construction, the temperature sensor is miniaturized and simplified in structure, and restrictions on the structure of the liquid jet head are reduced. It is to be noted that, from the temperature sensor which includes a thermistor, an electrical resistance value of the thermistor as the detected value is transmitted to the drive circuit. Based on the electrical resistance value of the thermistor, the magnitude of the drive voltage is determined.

Further, a liquid jet apparatus according to the present invention includes: transfer means for transferring a recording medium in a predetermined transfer direction; the liquid jet head disposed so that the nozzle holes are opposed to a surface of the recording medium transferred by the transfer means; and moving means for reciprocating the liquid jet head in a direction orthogonal to the transfer direction along the recording medium.

With the features described above, by discharging liquid from the nozzle holes toward the recording medium while the recording medium is transferred by the transfer means and the liquid jet head is reciprocated by the moving means, an image, text, or the like is recorded on the recording medium. Here, because the temperature of liquid is detected by the temperature sensor and the magnitude of the drive voltage to be applied to the drive electrodes of the head chip is determined based on the detected value, change in the amount of discharged liquid depending on the temperature of the liquid is suppressed and the amount of discharged liquid is fixed.

According to the liquid jet head and the liquid jet apparatus of the present invention, because the connecting wiring for connecting the temperature sensor and the drive circuit is formed on the flexible printed board and it is not necessary to route the connecting wiring when the liquid jet head is manufactured, the production efficiency may be improved to reduce costs.

Further, because it is not necessary to route the connecting wiring when the liquid jet head is manufactured, restrictions on the structure of the liquid jet head may be reduced.

Still further, because the connecting wiring formed on the flexible printed board is less liable to be corroded, incorrect temperature detection is less liable to occur.

DETAILED DESCRIPTION OF THE INVENTION

Embodiments of a liquid jet head and a liquid jet apparatus according to the present invention are described below with reference to the attached drawings.

It is to be noted that, in these embodiments, as an example of the liquid jet apparatus, an inkjet printer 1 which performs recording using a nonconductive non-aqueous ink (liquid) W is described.

(First Embodiment)

A first embodiment of the invention is described with reference to FIG. 1 to FIG. 6.

Figure 1:
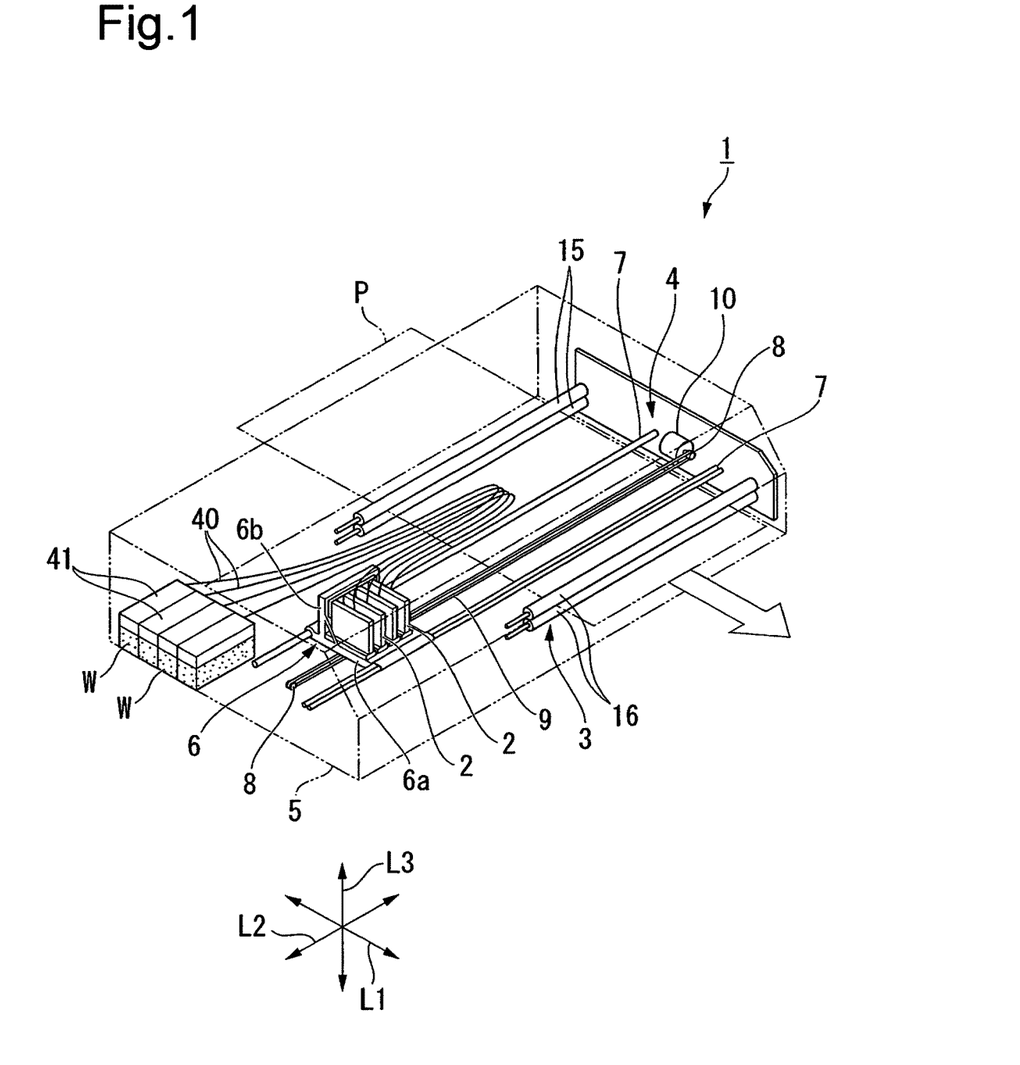
FIG. 1 is a perspective view of a liquid jet apparatus for describing a first embodiment of the present invention.

As illustrated in FIG. 1, the inkjet printer 1 according to this embodiment includes a plurality of ink jet heads (liquid jet heads) 2 for discharging the ink W, transfer means 3 for transferring recording paper (recording medium) P in a predetermined direction of the arrow L1 (transfer direction), and moving means 4 for reciprocating the plurality of ink jet heads 2 in a direction of the arrow L2 (scan direction) which is orthogonal to the transfer direction.

More specifically, the ink jet printer 1 is a printer of a so-called shuttle type which records text or an image on the recording paper P while transferring the recording paper P in the transfer direction and moving the ink jet heads 2 in the scan direction which is orthogonal to the transfer direction.

It is to be noted that, in this embodiment, a case in which four ink jet heads 2 for discharging the ink W of different colors (for example, black, cyan, magenta, and yellow) are included is described as an example. It is to be noted that the four ink jet heads 2 are identical in structure.

The four ink jet heads 2 are mounted on a carriage 6 which is incorporated in a case 5 substantially in the shape of a rectangular parallelepiped.

The carriage 6 includes a flat-plate-like base 6a for placing the plurality of ink jet heads 2 thereon and a wall portion 6b which stands upright from the base 6a, and is supported by guide rails 7 disposed along the scan direction so as to be reciprocated. Further, the carriage 6 is, under a state of being supported by the guide rails 7, coupled to a transfer belt 9 which is wound around a pair of pulleys 8. One pulley 8 of the pair of pulleys 8 is coupled to an output shaft of a motor 10 and is rotated when rotating driving force is applied thereto by the motor 10. With this, the carriage 6 is capable of being reciprocated in the scan direction.

In other words, the pair of guide rails 7, the pair of pulleys 8, the transfer belt 9, and the motor 10 function as the above-mentioned moving means 4.

Further, in the case 5, a pair of input rollers 15 and a pair of output rollers 16 are provided so as to be in parallel with each other with space interposed therebetween in the scan direction similarly to the pair of guide rails 7. The pair of input rollers 15 are provided on a back surface side of the case 5, while the pair of output rollers 16 are provided on a front surface side of the case 5. The pair of input rollers 15 and the pair of output rollers 16 are rotated by a motor (not shown) with the recording paper P sandwiched between each of the pairs. This enables the recording paper P to be transferred in the transfer direction from the back surface side to the front surface side of the case 5.

In other words, the pair of input rollers 15 and the pair of output rollers 16 function as the above-mentioned transfer means 3.

Figure 2:
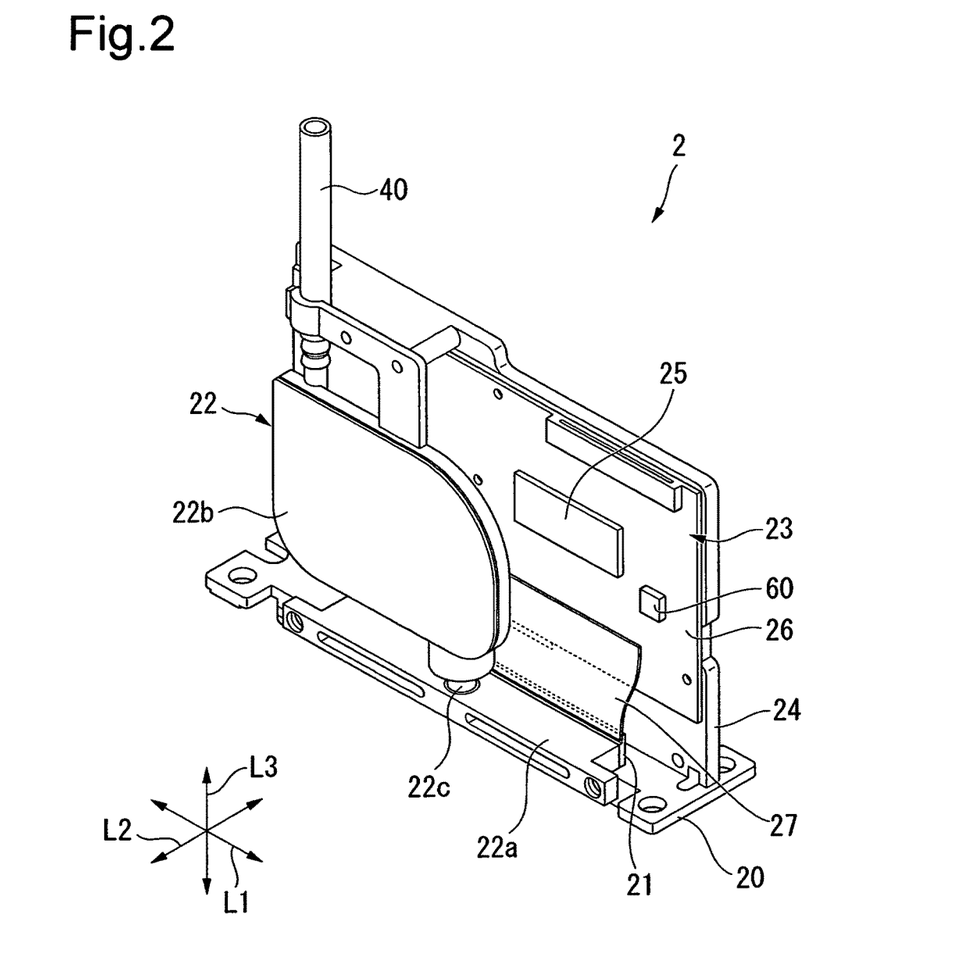
FIG. 2 is a perspective view of a liquid jet head for describing the first embodiment of the present invention.

As illustrated in FIG. 2, each of the ink jet heads 2 mainly includes a rectangular fixed plate 20 which is attached to the base 6a of the carriage 6 illustrated in FIG. 1 with screws (not shown), a head chip 21 fixed to an upper surface of the fixed plate 20, supply means 22 for supplying the ink W to an ink introduction port 31a to be described later of the head chip 21, control means 23 for applying drive a voltage to drive electrodes 37 to be described later, and a temperature sensor 50 for detecting temperature of the ink W in the head chip 21. Each of the ink jet heads 2 is disposed so that nozzle holes 33a thereof to be described later are opposed to a surface of the recording paper P which is transferred by the transfer means 3.

Figure 3:
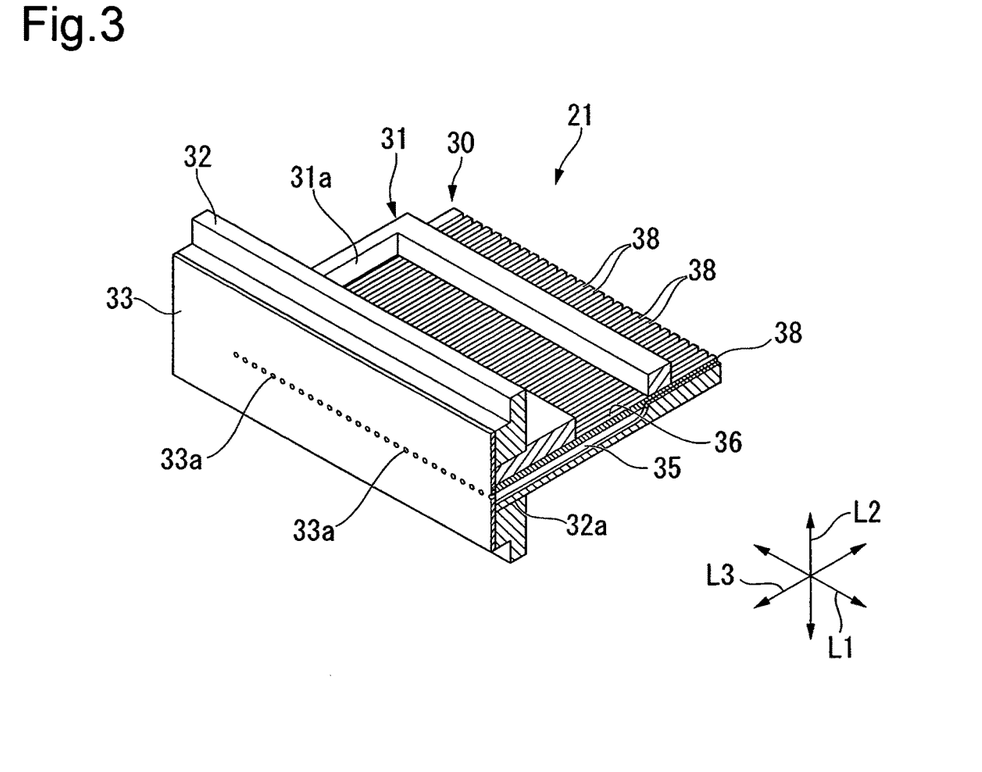
FIG. 3 is a perspective view of a head chip for describing the first embodiment of the present invention.

As illustrated in FIG. 3, the head chip 21 mainly includes an actuator plate 30, a cover plate 31, a support plate 32, and a nozzle plate 33. The cover plate 31 is stacked on the actuator plate 30 via an adhesive (not shown), and the nozzle plate 33 is stuck to end surfaces of the stacked actuator plate 30 and cover plate 31 via an adhesive (not shown).

The actuator plate 30 is a plate formed of a piezoelectric material such as lead zirconate titanate (PZT). As illustrated in FIG. 3 to FIG. 6, a plurality of channels 35 which extend in the direction of the arrow L3 (extension direction) are formed at regular intervals in the direction of the arrow L1 (arrangement direction) so as to be in parallel with one another on a surface of the cover plate 31 side (front surface) of the actuator plate 30. More specifically, the plurality of channels 35 are formed by partitioning by side walls 36. The channels 35 are discharge channels which are recessed viewed in section, into which the ink W is filled, and each of which communicates with the ink introduction port 31a of the cover plate 31 to be described later. One ends (tips) of the channels 35 in the direction of extension are open at an distal end surface of the actuator plate 30 (end surface on the nozzle plate 33 side). On the other hand, the other end portions (proximal end portions) of the channels 35 in the direction of extension extend to a midway of the actuator plate 30, and the depth thereof gradually becomes smaller toward the proximal end side (the side opposite to the nozzle plate 33 side). Further, shallow groove portions 38 which extend from the proximal ends of the channels 35 to a proximal end surface of the actuator plate 30 (end surface on the side opposite to the nozzle plate 33 side) are formed in the actuator plate 30. The shallow groove portions 38 are formed as extensions of the channels 35, and one ends thereof are open toward the inside of the channels 35 while the other ends thereof are open at the proximal end surface of the actuator plate 30 (end surface on the side opposite to the nozzle plate 33 side) and are sealed by sealing means (not shown).

Figure 4:
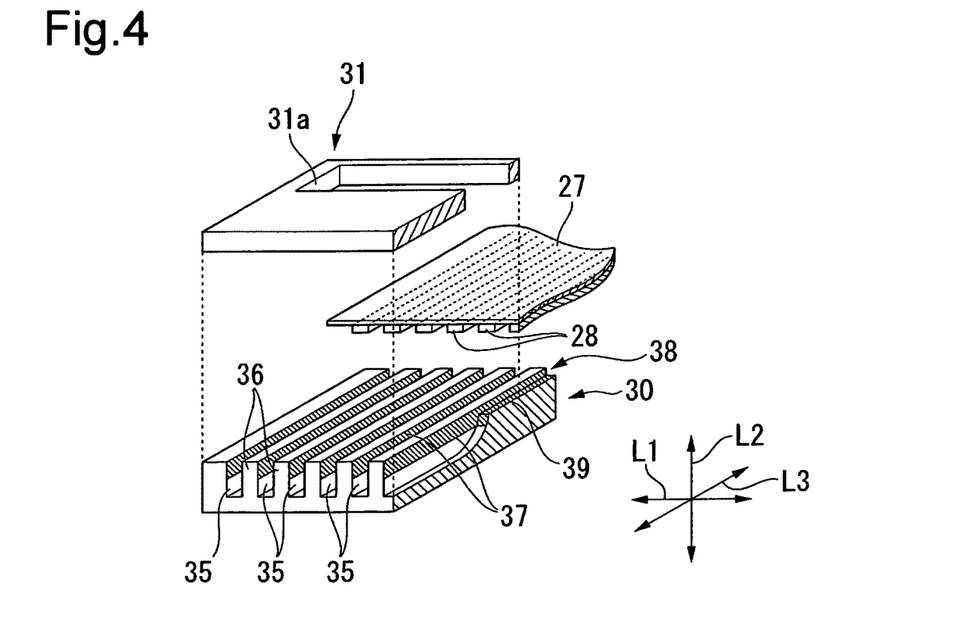
FIG. 4 is an exploded perspective view of the head chip for describing the first embodiment of the present invention.

The drive electrodes 37 are formed by vapor deposition or the like on the side walls 36 of the plurality of channels 35 described above in a length direction. The drive electrodes 37 formed on both side surfaces of the channels 35 are electrically connected to signal lines 28 on a flexible printed board 27 to be described later via connection electrodes 39.

The drive electrodes 37 have the function of, when the drive voltage is applied thereto, deforming the side walls 36 by a piezoelectric thickness shear effect, thereby increasing the pressure in the channels 35 to cause the filled ink W to be discharged from the channels 35.

The cover plate 31 is a plate formed of, for example, ceramic, and is stuck to the surface of the actuator plate 30 via the adhesive under a state in which proximal end side portions of the plurality of shallow groove portions 38 are exposed. Further, the ink introduction port 31a (liquid introduction port) through which the ink W is supplied from the supply means 22 is formed in the cover plate 31. The ink introduction port 31a is a rectangular opening and extends in the direction of arrangement of the channels 35 (direction of the arrow L1).

The support plate 32 not only supports the stacked actuator plate 30 and cover plate 31 but also supports the nozzle plate 33. A fitting hole 32a which extends in the direction of arrangement of the channels 35 (direction of the arrow L1) is formed in the support plate 32, and the stacked actuator plate 30 and cover plate 31 are supported under a state of being fitted into the fitting hole 32a. Here, a surface on a distal end side of the support plate 32 is flush with the end surfaces on a distal end side of the actuator plate 30 and the cover plate 31.

The nozzle plate 33 is a sheet-like plate formed of a film material such as polyimide having a thickness of about 50 μm, and is stuck to the end surfaces on the distal end side of the actuator plate 30 and the cover plate 31 and to the surface on the distal end side of the support plate 32 via an adhesive. In other words, one surface of the nozzle plate 33 is a surface stuck to the end surfaces on the distal end side of the actuator plate 30 and the cover plate 31 and to the surface on the distal end side of the support plate 32, while the other surface of the nozzle plate 33 is an opposing surface opposed to the recording paper P illustrated in FIG. 1. It is to be noted that the opposing surface of the nozzle plate 33 is coated with a water-repellent film for preventing adhesion of the ink W thereto and the like.

Further, the plurality of nozzle holes 33a are formed in the nozzle plate 33 in the direction of arrangement of the channels 35 (direction of the arrow L1) at predetermined intervals. The plurality of nozzle holes 33a are formed at places which are opposed to the channels 35, respectively, so as to communicate with the channels 35. The nozzle holes 33a are circularly formed so that outlines of outer shapes thereof are circular. In addition, the nozzle holes 33a are tapered holes the diameter of which is gradually reduced from the stuck surface side toward the opposing surface side, and an inlet diameter on the stuck surface side (the diameter of the outlines of the outer shapes of the nozzle holes 33a) is larger than an outlet diameter on the opposing surface side. It is to be noted that the nozzle holes 33a are formed using an excimer laser or the like.

The head chip 21 which is structured as described above is, as illustrated in FIG. 2, fixed to the upper surface of the fixed plate 20 as described above. A rectangular base plate 24 formed of aluminum or the like is fixed to the upper surface of the fixed plate 20 so as to be upright, and a flow path member 22a for supplying the ink W to the ink introduction port 31a of the head chip 21 is fixed to the upper surface of the fixed plate 20. A pressure damper (damper) 22b having therein a storing chamber for storing the ink W is disposed above the flow path member 22a under a state of being supported by the base plate 24. The pressure damper 22b and the flow path member 22a are coupled to each other via an ink coupling tube 22c. Further, a supply tube 40 through which the ink W is supplied is attached to an upper portion of the pressure damper 22b.

With the structure described above, when the ink W is supplied via the supply tube 40 to the pressure damper 22b, the ink W is once stored in the storing chamber in the pressure damper 22b, and then, the pressure damper 22b supplies a predetermined amount of the stored ink W via the ink coupling tube 22c and the flow path member 22a to the ink introduction port 31a of the head chip 21.

In other words, the flow path member 22a, the pressure damper 22b, and the ink coupling tube 22c function as the above-mentioned supply means 22.

It is to be noted that, as illustrated in FIG. 1, the supply tube 40 is coupled to an ink tank 41 incorporated in the case 5. This enables the ink W of different colors stored in the ink tanks 41 to be supplied to the four ink jet heads 2, respectively.

Figure 5:
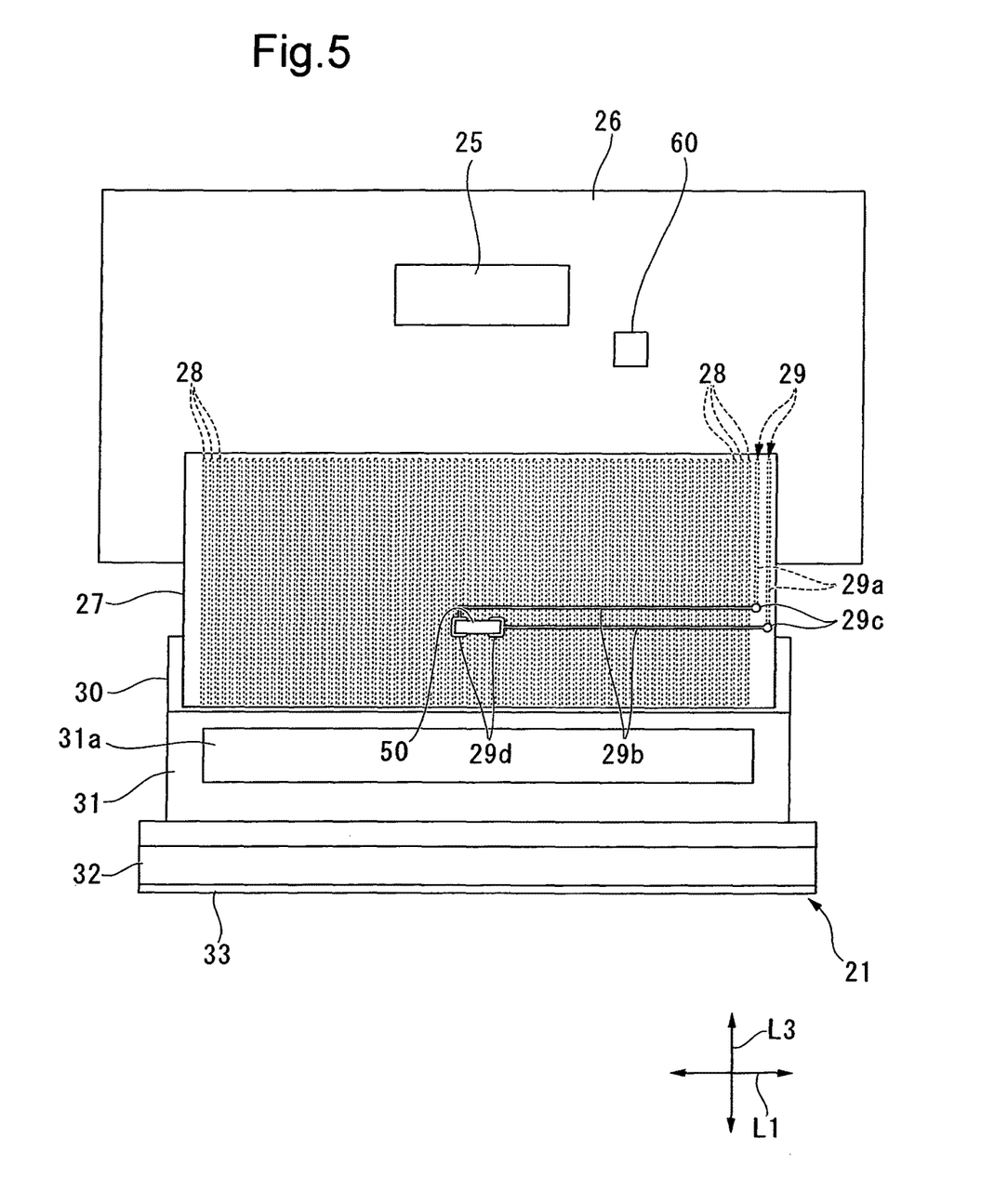
FIG. 5 is a side view illustrating the head chip, control means, and a temperature sensor for describing the first embodiment of the present invention.

On the other hand, as illustrated in FIG. 5, the temperature sensor 50 is arranged in proximity to the above-mentioned head chip 21. The temperature sensor 50 detects the temperature of the ink W in the head chip 21 by detecting temperature of the head chip 21. More specifically, the temperature sensor 50 is a temperature sensor which includes a thermistor. A thermistor is a resistor electrical resistance of which varies according to temperature change, and includes, for example, a metal oxide, a semiconductor, ceramic, or the like. Operating temperature of a thermistor is, for example, about minus several ten degrees to plus a hundred and several ten degrees.

The above-mentioned temperature sensor 50 is packaged on the flexible printed board 27 to be described later. More specifically, the temperature sensor 50 is mounted on lands 29d to be described later, and is arranged at a middle portion of the flexible printed board 27 which is located between the head chip 21 and a drive circuit board 26 to be described later. Further, the temperature sensor 50 is arranged at the middle portion of the flexible printed board 27 on the head chip 21 side and is arranged at a middle portion in a length direction of the head chip 21 (direction of the arrow L1).

Further, as illustrated in FIG. 2 and FIG. 5, the control means 23 for controlling drive of the head chip 21 is provided above the head chip 21 described above. The control means 23 applies, to the above-mentioned drive electrodes 37, the drive voltage, the magnitude of which is determined based on a value detected by the above-mentioned temperature sensor 50. More specifically, the control means 23 includes the drive circuit board 26, the flexible printed board 27 which is provided between the drive circuit board 26 and the head chip 21, and drive voltage value setting means 60 for determining the magnitude of the drive voltage based on the value detected by the temperature sensor 50.

The drive circuit board 26 is overlaid on and is attached with screws or the like to a surface on a head chip 21 side (surface opposed to the pressure damper 22b) of the base plate 24. A drive circuit 25 such as an integrated circuit for driving the head chip 21 is packaged on the drive circuit board 26, and a wiring pattern (not shown) which is electrically connected to the drive circuit 25 is formed on the drive circuit board 26.

Further, the drive voltage value setting means 60 is arranged on the drive circuit board 26. The drive voltage value setting means 60 includes a drive voltage table illustrating a relationship between the detected value detected by the temperature sensor 50 and a voltage value (drive voltage) to be applied to the drive electrodes 37, and determines the magnitude of the drive voltage which corresponds to the temperature of the ink W which is detected by the temperature sensor 50. The drive voltage value setting means 60 is electrically connected to the drive circuit 25 via a wiring pattern (not shown) which is formed on the drive circuit board 26, and information of the drive voltage is transmitted from the drive voltage value setting means 60 to the drive circuit 25. The drive circuit 25 applies to the drive electrodes 37 the drive voltage, the magnitude of which is determined by the drive voltage value setting means 60.

The flexible printed board 27 is a thin-film-like printed board which is flexible and is deformable to a large extent.

Figure 6:
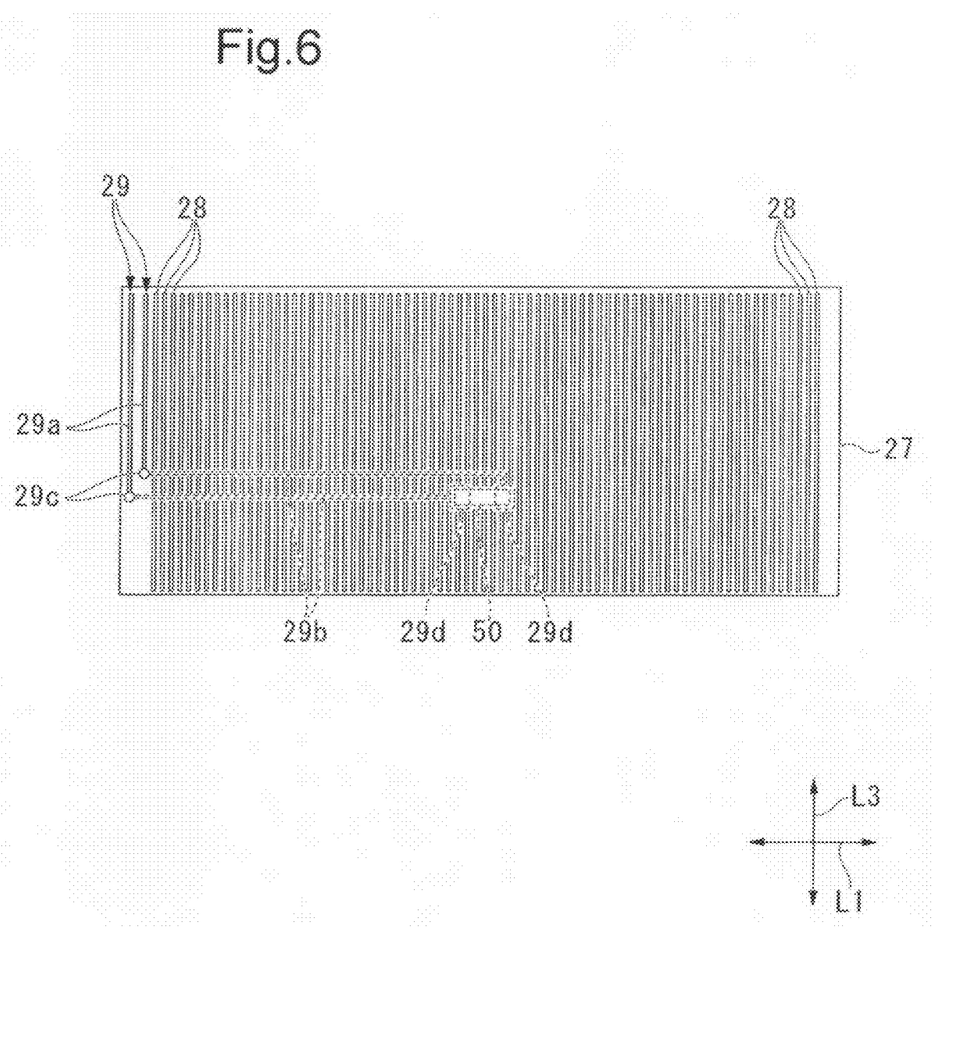
FIG. 6 is a side view illustrating a flexible printed board and the temperature sensor for describing the first embodiment of the present invention.

One end of the flexible printed board 27 is fixed to the drive circuit board 26 while the other end of the flexible printed board 27 is fixed to a proximal end portion (an end portion opposite to the nozzle plate 33 side) of the actuator plate 30. As illustrated in FIG. 6, the plurality of signal lines 28 for electrically connecting the drive circuit 25 and the plurality of drive electrodes 37, respectively, are formed on the one surface (surface on a base plate 24 side) of the flexible printed board 27. As illustrated in FIG. 4 to FIG. 6, the signal lines 28 are strip-like wiring patterns which extend from the head chip 21 side toward the drive circuit board 26 side, and are print-wired on the one surface of the flexible printed board 27. One ends of the signal lines 28 are electrically connected to a wiring pattern (not shown) which is formed on the drive circuit board 26. The other ends of the signal lines 28 fit into the proximal end side portions of the shallow groove portions 38 in the actuator plate 30 which are exposed on a proximal end side (upper side of FIG. 5) of the cover plate 31, thereby being in contact with and electrically connected to the connection electrodes 39, respectively. This electrically connects the other ends of the signal lines 28 via the connection electrodes 39 to the drive electrodes 37, respectively.

Further, as illustrated in FIG. 5 and FIG. 6, a pair of connecting wirings 29 for electrically connecting the above-mentioned temperature sensor 50 and the drive voltage value setting means 60 are formed on the flexible printed board 27. One of the pair of connecting wirings 29 is electrically connected to one lead electrode of the temperature sensor 50 and the other of the pair of connecting wirings 29 is electrically connected to the other lead electrode of the temperature sensor 50. More specifically, the connecting wirings 29 include first connecting wirings 29a which are formed on the one surface of the flexible printed board 27 illustrated in FIG. 6, second connecting wirings 29b which are formed on the other surface of the flexible printed board 27 illustrated in FIG. 5 (surface of the flow path member 22a side and the pressure damper 22b side), and through wirings 29c which pass through the flexible printed board 27 to connect the first connecting wirings 29a and the second connecting wirings 29b, respectively.

As illustrated in FIG. 6, the first connecting wirings 29a are strip-like wiring patterns which extend so as to be in parallel with the signal lines 28, and are arranged to a side of the plurality of signal lines 28, that is, in a side end portion of the flexible printed board 27. The first connecting wirings 29a of the pair of connecting wirings 29 are disposed so as to be in parallel with each other with space interposed therebetween. Further, end portions (upper end portions of FIG. 6) on the drive circuit board 26 side of the first connecting wirings 29a are electrically connected to wiring patterns (not shown) on the drive circuit board 26, respectively, and are electrically connected to the drive voltage value setting means 60 via the wiring patterns, respectively.

As illustrated in FIG. 5, the second connecting wirings 29b are strip-like wiring patterns which extend from the middle portion in the width direction (direction of the arrow L1) of the flexible printed board 27 toward the side end portion of the flexible printed board 27. The second connecting wirings 29b of the pair of connecting wirings 29 are disposed so as to be in parallel with each other with space interposed therebetween. Further, as illustrated in FIG. 5, the lands 29d for packaging the temperature sensor 50 are formed at end portions on the substrate middle side of the second connecting wirings 29b, respectively. More specifically, the lands 29d are metal foil (for example, copper foil) for soldering the temperature sensor 50, and the lands 29d of the two second connecting wirings 29b are arranged side by side with space interposed therebetween. One lead electrode of the temperature sensor 50 is soldered to one of the pair of lands 29d while the other lead electrode of the temperature sensor 50 is soldered to the other of the pair of lands 29d. In this way, the temperature sensor 50 is packaged on the other surface of the flexible printed board 27.

The through wirings 29c are wirings which are arranged to the side of the plurality of signal lines 28, that is, in the side end portion of the flexible printed board 27 and which pass through the flexible printed board 27, and, as illustrated in FIG. 5 and FIG. 6, are provided between end portions on the head chip 21 side of the first connecting wirings 29a and end portions on the substrate side end side of the second connecting wirings 29b.

Further, heat is transferred between the head chip 21 and the above-mentioned temperature sensor 50 (the heat chip 21 and the temperature sensor 50 are thermally coupled to each other) via the signal lines 28 printed on the flexible printed board 27, and thus, the temperature sensor 50 acquires the temperature of the head chip 21. More specifically, the temperature of the head chip 21 is transmitted to the signal lines 28 which are in contact with the connection electrodes 39 of the head chip 21, transmitted from the signal lines 28 via the flexible printed board 27 to the lands 29d, and then transmitted from the lands 29d to the temperature sensor 50.

Next, action of the ink jet heads 2 which are structured as described above is described.

In the ink jet head 2 structured as described above, at a step of forming the signal lines 28 on the flexible printed board 27, the connecting wirings 29 are formed on the flexible printed board 27. More specifically, the signal lines 28 and the first connecting wirings 29a are print-wired on the one surface of the flexible printed board 27, the second connecting wirings 29b and the lands 29d are print-wired on the other surface of the flexible printed board 27, and further, the through wirings 29c are formed in through holes formed in the side end portion of the flexible printed board 27.

By this construction, it is not necessary to route a lead wire or the like when the inkjet head 2 is manufactured, and, by providing the flexible printed board 27 between the head chip 21 and the drive circuit board 26, the temperature sensor 50 and the drive voltage value setting means 60 are connected to each other via the connecting wirings 29 on the flexible printed board 27.

Further, the connecting wirings 29 which are print-wired on the flexible printed board 27 are less liable to be corroded by the volatilized ink W than a lead wire or the like.

Further, the temperature sensor 50 is packaged in advance on the flexible printed board 27 before the flexible printed board 27 is provided between the head chip 21 and the drive circuit board 26. More specifically, lead electrodes of the temperature sensor 50 are soldered to the lands 29d which are formed on the flexible printed board 27, and the temperature sensor 50 is packaged on the flexible printed board 27. After that, one end of the flexible printed board 27 is connected to the drive circuit 25, the other end of the flexible printed board 27 is connected to the head chip 21, and the flexible printed board 27 is provided between the head chip 21 and the drive circuit board 26.

This eliminates the necessity of the work to attach the temperature sensor 50 when the ink jet head 2 is manufactured. More specifically, by providing the flexible printed board 27 between the head chip 21 and the drive circuit board 26, the temperature sensor 50 is arranged in proximity to the head chip 21.

Next, a case is described, in which text, graphics, or the like is recorded on the recording paper P using the ink jet printer 1 structured as described above.

It is to be noted that, in an initial state, the four ink tanks 41 are assumed to be sufficiently filled with the ink W of different colors. Further, the four colors of the ink W in the ink tanks 41 are in a state of being supplied via the supply tubes 40 to the pressure dampers 22b, respectively. Therefore, a predetermined amount of the ink W is supplied via the ink coupling tube 22c and the flow path member 22a to the ink introduction port 31a of the head chip 21, and the ink W is now in a state of being filled into the channels 35 from the ink introduction port 31a.

With such an initial state, when ink jet printer 1 is operated, the pair of input rollers 15 and the pair of output rollers 16 are rotated to transfer the recording paper P in the transfer direction (direction of the arrow L1). Further, at the same time, the motor 10 rotates the pulleys 8 to move the transfer belt 9. This reciprocates the carriage 6 in the scan direction (direction of the arrow L2) under a state of being guided by the guide rails 7.

Meanwhile, the four colors of the ink W are appropriately discharged from the head chips 21 of the ink jet heads 2, respectively, toward the recording paper P, and thus text, an image, or the like may be recorded. In particular, because the ink jet printer 1 is of a shuttle type, an accurate recording may be performed in a desired range on the recording paper P.

Here, operation of the ink jet heads 2 is described in detail in the following.

First, the temperature of the ink W in the head chip 21 is detected by the temperature sensor 50, and the detected value is transmitted via the connecting wirings 29 to the drive voltage value setting means 60. More specifically, because the electrical resistance of the temperature sensor 50 which includes a thermistor varies according to temperature, the temperature of the head chip 21 is detected by, for example, the magnitude of electric current which flows between the temperature sensor 50 arranged in proximity to the head chip 21 and the drive voltage value setting means 60, and further, the temperature of the ink W in the head chip 21 is detected.

On the other hand, when the carriage 6 begins to reciprocate, the drive circuit 25 applies the drive voltage via the signal lines 28 on the flexible printed board 27 to the drive electrodes 37. More specifically, the drive voltage is applied to the drive electrodes 37 which are provided on two side walls 36, respectively, on both sides of the channel 35 from which the ink W is discharged, and the two side walls 36 are caused to be deformed so as to move outside toward channels 35 adjacent to the channel 35 from which the ink W is discharged. In other words, the channel 35 from which the discharge is made is deformed as if it bulged. Further, here, the drive voltage value setting means 60 determines the magnitude of the drive voltage according to the value detected by the temperature sensor 50 using the above-mentioned drive voltage table, and information of the drive voltage is transmitted to the drive circuit 25 and the drive circuit 25 applies the drive voltage of the determined magnitude to the drive electrodes 37. Therefore, the amount of deformation of the two side walls 36 described above corresponds to the temperature (viscosity) of the ink W.

The deformation of the two side walls 36 described above by the piezoelectric thickness shear effect increases the capacity of the channel 35 from which the discharge is made. Because the capacity of the channel 35 increases, the ink W is guided from the ink introduction port 31a into the channel 35. The ink W guided into the channel 35 passes through the channel 35 as a pressure wave, and, when the pressure wave reaches the nozzle holes 33a, the drive voltage applied to the drive electrodes 37 is made to be zero. This causes the deformed side walls 36 to return to their original locations, and the capacity of the channel 35 which has once increased returns to the original capacity. This operation increases the pressure in the channel 35 from which the discharge is made, and the ink W is pressurized. As a result, the ink W is discharged from the channel 35.

It is to be noted that the drive electrodes 37 described here are formed so as to function separately from each other as electrodes for selectively discharging the ink W from channels 35 which are adjacent to one another. Further, when further pressurization of the ink W is necessary in order to discharge the ink W with stability, the side walls 36 are caused to be deformed so as to move inside the channel 35 from which the discharge is made. This operation further increases the pressure in the channel 35 from which the discharge is made, and thus, the ink W may be further pressurized. However, as described above, the purpose of the operation is to discharge the ink W with stability, and thus, the operation is not indispensable and may be used as necessary.

Further, according to this embodiment, because the non-aqueous ink W is used, by combining as necessary and executing the respective operations described above, optimum discharge of the ink W may be achieved.

The discharged ink W is discharged via the nozzle hole 33a to the outside. Further, the ink W becomes a liquid droplet, that is, an ink droplet, when passing through the nozzle hole 33a to be discharged. As a result, as described above, text, an image, or the like may be recorded on the recording paper P.

In particular, because the nozzle holes 33a according to this embodiment are tapered in section, ink droplets may be discharged at high speed in a straight line. Therefore, recording of a high quality image may be performed.

According to the ink jet head 2 and the ink jet printer 1 structured as described above, because the temperature of the ink W is detected by the temperature sensor 50 and the drive voltage, the magnitude of which is determined based on the detected value is applied to the drive electrodes 37, the amount of the discharged ink W may be fixed.

Further, because the connecting wirings 29 for connecting the temperature sensor 50 and the drive voltage value setting means 60 are formed on the flexible printed board 27 and it is not necessary to route a lead wire or the like when the ink jet head 2 is manufactured, the production efficiency may be improved, and as a result, costs may be reduced.

In particular, in the inkjet head 2 structured as described above, because the temperature sensor 50 is packaged on the flexible printed board 27 and the necessity of the work to attach the temperature sensor 50 when the ink jet head 2 is manufactured is eliminated, the production efficiency may be further improved and costs may be reduced.

Further, because it is not necessary to route a lead wire or the like when the ink jet head 2 is manufactured, restrictions on the structure of the inkjet head 2 may be reduced. More specifically, it is not necessary for the structure to enable routing a lead wire or the like, and hence restrictions on the location and the dimensions of the outer shape of other members including the pressure damper 22b may be reduced.

Further, because the connecting wirings 29 which are formed on the flexible printed board 27 are less liable to be corroded than a lead wire or the like, incorrect temperature detection is less liable to occur.

Still further, in the ink jet head 2 structured as described above, the signal lines 28 are formed on the one surface of the flexible printed board 27 and the temperature sensor 50 is packaged on the other surface, and the location of the packaged temperature sensor 50 is not limited to a side end portion of the flexible printed board 27 or the like having no signal lines 28 and the temperature sensor 50 may be arranged at an arbitrary position on the flexible printed board 27. Therefore, in the ink jet head 2 described above, the temperature sensor 50 is arranged on the middle portion in the width direction (direction of the arrow L1) of the flexible printed board 27, which enables proper detection of the temperature of the ink W in the whole head chip 21 by one temperature sensor 50.

Further, because the temperature sensor 50 described above includes a thermistor, the temperature sensor 50 is miniaturized and simple in structure, and hence restrictions on the structure of the ink jet head 2 may be reduced.

(Second Embodiment)

Next, a second embodiment is described with reference to FIG. 7.

It is to be noted that this embodiment is different from the first embodiment in the structure of lands 29e which are formed on the flexible printed board 27, but other structures are similar to those of the first embodiment. Therefore, in this embodiment, only the lands 29e are described and description of structures which are similar to those of the first embodiment is omitted.

Figure 7:
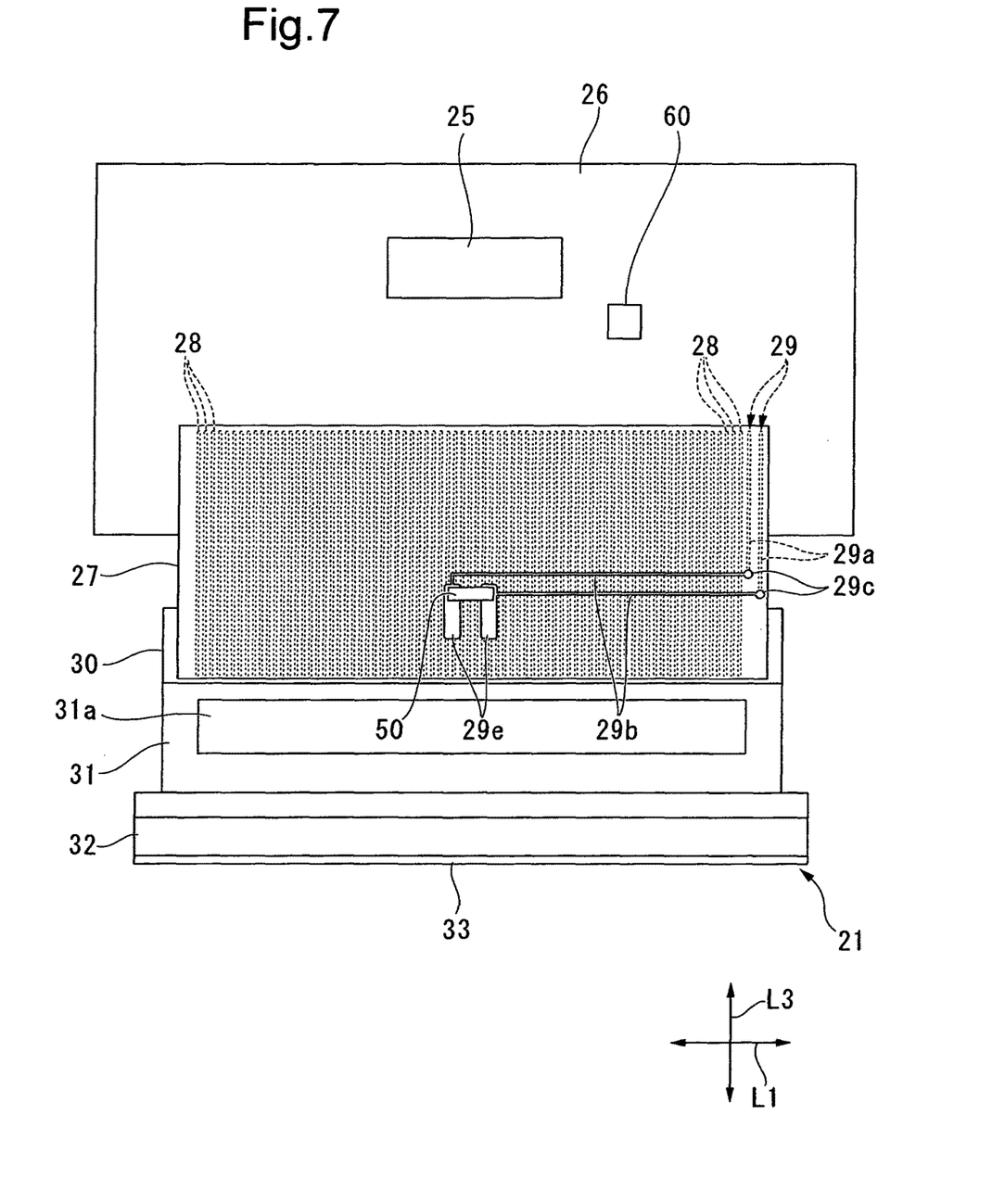
FIG. 7 is a side view illustrating a head chip, control means, and a temperature sensor for describing a second embodiment of the present invention.

As illustrated in FIG. 7, the lands 29e are provided so as to extend from the middle portion of the flexible printed board 27 to a connecting end portion on the head chip 21 side of the flexible printed board 27. More specifically, the lands 29e are extended downward, and one end portions of the lands 29e are arranged at the middle portion of the flexible printed board 27 which is located between the head chip 21 and the drive circuit board 26, while the other end portions of the lands 29e are arranged in a lower end portion of the flexible printed board 27 which is overlapped on the proximal end portion of the actuator plate 30.

With this, the temperature of the head chip 21 is transmitted via the lands 29e to the temperature sensor 50, and thus, the detection accuracy of the temperature of the ink W in the head chip 21 by the temperature sensor 50 is improved. As a result, the amount of the discharged ink W may be more accurately fixed.

(Third Embodiment)

Next, a third embodiment is described with reference to FIG. 8.

It is to be noted that, according to this embodiment, a heat conductive resin 29f is applied to the temperature sensor 50, but other structures of this embodiment are similar to those of the first embodiment . Therefore, in this embodiment, only the heat conductive resin 29f is described and description of structures which are similar to those of the first embodiment is omitted.

Figure 8:
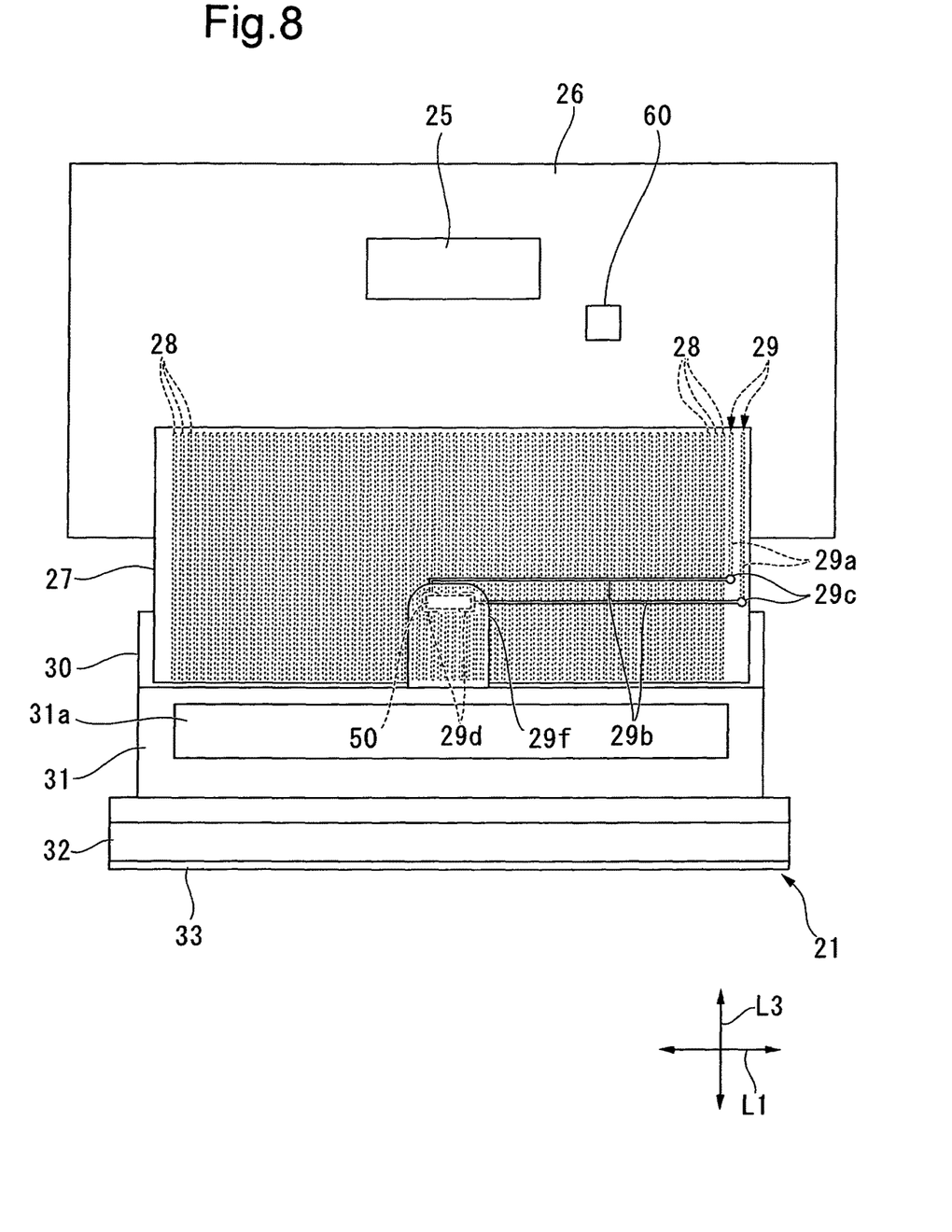
FIG. 8 is a side view illustrating a head chip, control means, and a temperature sensor for describing a third embodiment of the present invention.

As illustrated in FIG. 8, the heat conductive resin 29f is applied to the temperature sensor 50 which is packaged on the flexible printed board 27. As the heat conductive resin 29f, for example, a resin the main component of which is heat conductive silicone or the like may be used. The heat conductive resin 29f is applied so as to cover the whole temperature sensor 50. Further, the heat conductive resin 29f is provided so as to extend from the middle portion of the flexible printed board 27 to the connecting end portion on the head chip 21 side of the flexible printed board 27, and a part thereof is in contact with the proximal end portion of the actuator plate 30 and a proximal end portion of the cover plate 31 of the head chip 21.

With this, the temperature of the head chip 21 is transmitted via the heat conductive resin 29f to the temperature sensor 50, and thus, the detection accuracy of the temperature of the ink W in the head chip 21 by the temperature sensor 50 is improved. As a result, the amount of the discharged ink W may be more accurately fixed.

The first to third embodiments according to the present invention are described in the above, but the present invention is not limited to the embodiments described above, and appropriate modifications which fall within the gist of the present invention are possible.

For example, in the above-mentioned embodiments, as an example of the liquid jet apparatus, the ink jet printer 1 is described, but the present invention is not limited to a printer, and, for example, may be applied to a facsimile machine or an on-demand printer.

Further, in the embodiments described above, the plurality of nozzle holes 33a are arranged in a straight line in the direction of arrangement, but, according to the present invention, the plurality of nozzle holes 33a may be not linearly arranged and may be arranged with longitudinal displacement (direction of the arrow L2). For example, the plurality of nozzle holes 33a may be in an oblique arrangement or may be in a zigzag arrangement.

Further, the shape of the nozzle holes 33a is not limited to a circle, and may be, for example, a polygon such as a triangle, an oval, or a star.

Further, in the embodiments described above, the ink introduction port 31a is formed in the cover plate 31, but, according to the present invention, the ink introduction port may be formed in the actuator plate. For example, an ink introduction port may extend in the direction of arrangement and may be recessed in section is formed in a rear surface (a surface opposite to a front surface in which the channels are formed) of the actuator plate and a slit for communicating with the channels may be formed in a bottom surface of the ink introduction port. It is to be noted that, in this case, the locations of the base plate 24 to which the drive circuit board 26 is fixed and of the supply means 22 may be changed to arrange the supply means 22 so as to be overlaid on the actuator plate and to dispose the base plate 24 so as to be overlapped on the cover plate 31.

Further, in the embodiments described above, a case in which the non-aqueous ink W is used is described, but, for example, conductive aqueous ink, solvent ink, oil ink, or UV ink may be used.

It is to be noted that, when aqueous ink is used, the head chip may be structured as follows.

That is, in the actuator plate, discharge channels which function as discharge channels into which ink is filled and dummy channels which function as dummy channels into which ink is not filled are alternately formed in the direction of arrangement. A slit is formed in the bottom surface of the ink introduction port at a place which is opposed to the discharge channels. This causes ink to flow from the ink introduction port via the slit to be filled into only the discharge channels. Nozzle holes are formed in the nozzle plate at places which are opposed to the discharge channels.

By structuring the head chip 21 in this way, even if aqueous ink is used, the drive electrodes which are provided on the discharge channels and the drive electrodes which are provided on the dummy channels may be separately used in an electrically separated state without continuity therebetween via the ink. Therefore, aqueous ink may be used to perform recording.

In particular, because even conductive ink may be used without a problem, the added value of the ink jet printer may be increased. It is to be noted that other actions and effects may be produced similarly.

Further, in the embodiments described above, a thermistor is used as the temperature sensor 50, but, according to the present invention, other temperature sensors may be used. For example, a thermocouple or the like may be used as the temperature sensor.

Further, in the embodiments described above, the signal lines 28 are formed on the one surface of the flexible printed board 27 while the temperature sensor 50 is packaged on the other surface, but, according to the present invention, the signal lines 28 and the temperature sensor 50 may be arranged on a same surface of the flexible printed board 27. For example, the temperature sensor 50 may be arranged to a side of the plurality of signal lines 28, that is, in the side end portion of the flexible printed board 27.

Further, in the embodiments described above, the temperature sensor 50 is packaged on the flexible printed board 27, but, according to the present invention, it is possible to attach the temperature sensor 50 to something other than the flexible printed board 27. For example, the temperature sensor 50 may be attached to the head chip 21, or the temperature sensor 50 may be attached to the flow path member 22a.

Further, in the embodiments described above, the drive voltage value setting means 60 is arranged on the drive circuit board 26, but the present invention is not limited thereto. For example, the drive voltage value setting means 60 may be arranged in a control portion (not shown) of the ink jet printer 1. In this case, the connecting wirings 29 on the flexible printed board 27 and the drive voltage value setting means 60, and the drive circuit 25 and the drive voltage value setting means 60 are electrically connected via wirings for connecting the drive circuit board 26 and the above-mentioned control portion, respectively.

Further, in the embodiments described above, as illustrated in FIG. 5 to FIG. 8, the pair of first connecting wirings 29a are arranged side by side on one side in a direction of a long side of the flexible printed board 27, but the present invention is not limited thereto. For example, one of the first connecting wirings 29a may be arranged to a side in the direction of the long side of the flexible printed board 27 and the other of the first connecting wirings 29a may be arranged to the other side. Further, the first connecting wirings 29a may be arranged substantially at the middle portion in the direction of the long side of the flexible printed board 27. More specifically, the first connecting wirings 29a may be routed between the plurality of signal lines 28 which are provided in parallel with one another, that is, between adjacent signal lines 28. With this, when the temperature sensor 50 is located substantially at the middle portion in the direction of the long side of the flexible printed board 27, it is not necessary to route the connecting wirings 29 from the end portion in the direction of the long side of the flexible printed board 27.

Further, according to the present invention, the metal foil for soldering the temperature sensor 50 is not limited to the copper foil, and any metal may be used insofar as the head chip 21 and the temperature sensor 50 are thermally coupled to each other (heat is transferred therebetween) so that the temperature of the head chip 21 is acquired.

Additionally, a structural element in the embodiments described above may be appropriately replaced by a well known structural element within the gist of the present invention, and, the embodiments described above may be appropriately combined.

DESCRIPTION OF SYMBOLS 1 ink jet printer (liquid jet apparatus)
2 ink jet head (liquid jet head)
3 transfer means
4 moving means
21 head chip
23 control means
25 drive circuit
26 drive circuit board
27 flexible printed board
28 signal line
29 connecting wiring
29e land
29f heat conductive resin
33a nozzle hole
35 channel
36 side wall
37 drive electrode
50 temperature sensor
60 drive voltage value setting means
P recording paper (recording medium)
W ink (liquid)

The invention claimed is:

1. A liquid jet head comprising:
a head chip including a plurality of channels arranged parallel to one another at preselected intervals and configured to be filled with a liquid, a plurality of drive electrodes formed on respective side walls of the plurality of channels, and a plurality of nozzle holes communicating with respective ones of the plurality of channels;
a temperature sensor arranged in or in proximity to the head chip for detecting a temperature of the liquid filled in the plurality of channels of the head chip;
a drive circuit board having a drive circuit configured to drive the head chip;
drive voltage value setting means for determining a magnitude of a drive voltage based on a value of a temperature detected by the temperature sensor;
a flexible printed board located between the head chip and the drive circuit board, the flexible printed board having signal lines formed thereon for electrically connecting the drive circuit to the drive electrodes of the head chip, and having connecting wiring formed thereon for electrically connecting the temperature sensor to the drive voltage value setting means; and
control means for applying a drive voltage, the magnitude of which is determined by the drive voltage value setting means, from the drive circuit to the drive electrodes of the head chip via the signal lines of the flexible printed board so as to increase a pressure in each of the plurality of channels by deformation of the side walls to thereby discharge the liquid in the plurality of channels from the respective plurality of nozzle holes;
wherein the temperature sensor is mounted on a land formed at a middle portion of the flexible printed board, the land extending from the middle portion of the flexible printed board to a connecting end portion thereof which connects the flexible printed board and the head chip at the head chip side of the flexible printed board.

2. A liquid jet head according to claim 1; further comprising a heat conductive resin applied to the temperature sensor.

3. A liquid jet head according to claim 1; wherein the signal lines are formed on one surface of the flexible printed board and the temperature sensor is mounted on another surface of the flexible printed board different from the one surface.

4. A liquid jet head according to claim 1; wherein the signal lines are formed on one surface of the flexible printed board and the temperature sensor is mounted on another surface of the flexible printed board different from the one surface.

5. A liquid jet head according to claim 1; wherein the temperature sensor comprises a thermistor.

6. A liquid jet head according to claim 1; wherein the control means includes the drive circuit board, the drive head chip, and the drive voltge value setting means.

7. A liquid jet apparatus comprising:
transfer means for transferring a recording medium in a predetermined transfer direction;
a liquid jet head according to claim 1 disposed so that the nozzle holes of the head chip are opposed to a surface of the recording medium transferred by the transfer means; and
moving means for reciprocating the liquid jet head in a direction orthogonal to the predetermined transfer direction along the recording medium.

8. A liquid jet head comprising:
a head chip comprised of a plurality of channels having side walls each provided with a drive electrode, and a plurality of nozzle holes communicating with the respective plurality of channels;
a temperature sensor configured to detect a temperature of a liquid in the plurality of channels of the head chip;
determining means electrically connected to the temperature sensor for determining a magnitude of a drive voltage based on the temperature of the liquid detected by the temperature sensor;
control means for applying a drive voltage of the magnitude determined by the determining means to the drive electrodes of the head chip so as to increase a pressure in each of the plurality of channels by deformation of the side walls to thereby discharge the liquid in the plurality of channels from the respective plurality of nozzle holes; and
a flexible printed board having connecting wiring formed thereon for electrically connecting the temperature sensor to the determining means, the temperature sensor being mounted on a land formed at a middle portion of the flexible printed board, the land extending from the middle portion of the flexible printed board to a connecting end portion thereof which connects the flexible printed board and the head chip at the head chip side of the flexible printed board.

9. A liquid jet head according to claim 8; further comprising a drive circuit board having a drive circuit configured to drive the head chip, and a flexible printed board having signal lines formed thereon for electrically connecting the drive circuit to the drive electrodes of the head chip, wherein the control means applies the drive voltage from the drive circuit to the plurality of drive electrodes via the signal lines.

10. A liquid jet head according to claim 9; wherein the temperature sensor and the head chip are thermally coupled to each other via the signal lines of the flexible printed board.

11. A liquid jet apparatus comprising:
transfer means for transferring a recording medium in a predetermined transfer direction;
a liquid jet head according to claim 8 disposed so that the nozzle holes of the head chip are opposed to a surface of the recording medium transferred by the transfer means; and
moving means for reciprocating the liquid jet head in a direction orthogonal to the predetermined transfer direction along the recording medium.

* * * * *